(12) United States Patent
Disser

(10) Patent No.: US 7,545,163 B2
(45) Date of Patent: Jun. 9, 2009

(54) THREE PHASE MOTOR DIAGNOSTICS AND PHASE VOLTAGE FEEDBACK UTILIZING A SINGLE A/D INPUT

(75) Inventor: Robert J. Disser, Dayton, OH (US)

(73) Assignee: Delphi Technologies, Inc., Troy, MI (US)

( * ) Notice: Subject to any disclaimer, the term of this patent is extended or adjusted under 35 U.S.C. 154(b) by 343 days.

(21) Appl. No.: 11/359,322

(22) Filed: Feb. 22, 2006

(65) Prior Publication Data
US 2007/0205798 A1    Sep. 6, 2007

(51) Int. Cl.
*G01R 31/34*    (2006.01)
*G08B 21/00*    (2006.01)
*H02H 7/08*    (2006.01)

(52) U.S. Cl. .................... 324/772; 340/648; 318/490

(58) Field of Classification Search ............... 324/772; 340/648
See application file for complete search history.

(56) References Cited

U.S. PATENT DOCUMENTS

| | | | |
|---|---|---|---|
| 4,864,242 A * | 9/1989 | Hurley | 324/510 |
| 5,448,492 A * | 9/1995 | Kolomyski et al. | 700/293 |
| 5,519,300 A | 5/1996 | Leon et al. | |
| 5,574,346 A * | 11/1996 | Chavan et al. | 318/434 |
| 6,448,738 B1 | 9/2002 | Burton et al. | |
| 6,462,495 B1 | 10/2002 | Copeland | |
| 6,469,461 B1 | 10/2002 | Konda et al. | |
| 6,661,192 B2 | 12/2003 | Copeland | |
| 2005/0237212 A1 * | 10/2005 | Gustafson et al. | 340/679 |

* cited by examiner

*Primary Examiner*—Ha Tran T Nguyen
*Assistant Examiner*—Roberto Velez
(74) *Attorney, Agent, or Firm*—Thomas N. Twomey

(57) ABSTRACT

A motor system utilizes a single feedback output to determine various fault states for a 3-phase motor in a non-operational condition. The same single feedback output may be used to determine the applied phase voltage for a 3-phase motor in an operational condition.

9 Claims, 4 Drawing Sheets

THREE PHASE MOTOR DIAGNOSTICS AND PHASE VOLTAGE FEEDBACK UTILIZING A SINGLE A/D INPUT

TECHNICAL FIELD

The present application relates generally to 3 phase motor diagnostics and phase voltage monitoring, and more particularly to a method and apparatus to provide both motor diagnostics and phase voltage feedback via a single processor A/D input, particularly in connection with a pulse width modulation (PWM) controlled electric motor.

BACKGROUND

Providing motor diagnostic functions in connection with electronically commutated motors has previously been achieved utilizing diagnostic circuits having a diagnostic output for each motor phase. Voltage levels established at these outputs are delivered to respective A/D inputs of a microcontroller or other processor for conversion and analysis. There is a need for a motor system and method for providing diagnostic feedback and phase voltage level feedback with less outputs so as to reduce the number of A/D channels required for analysis.

SUMMARY

In one aspect, a motor system includes a 3-phase DC motor having first, second and third phase windings and a drive circuit for selectively effecting energization of the first, second and third phase windings during motor operation. A diagnostic and phase feedback circuit is connected for indicating, during non-operation of the motor, at least a no fault state, a first fault state and a second fault state. The diagnostic circuit has one diagnostic output line at which (i) a no fault analog voltage condition is established during the no fault state, (ii) a first fault analog voltage condition is established during the first fault state and (iii) a second fault analog voltage condition is established during the second fault state, each of the voltage conditions distinct from each other. A controller has an A/D converter operatively connected with the one diagnostic output line, the controller operable to monitor an output of the A/D converter to identify the presence of each of the no fault state, the first fault state and the second fault state. In one example, (i) the controller identifies the no fault state if voltage at the diagnostic output line is within a first voltage range, (ii) the controller identifies the first fault state if voltage at the diagnostic output line is within a second voltage range and (iii) the controller identifies the second fault state if voltage at the diagnostic output line is within a third voltage range, where the first, second and third voltage ranges are non-overlapping.

DETAILED DESCRIPTION

Suitable diagnostic feedback and analysis is achieved in an electronically commutated motor by utilizing a diagnostic circuit having a single diagnostic output voltage. Distinct output voltage conditions are established for different fault conditions. The microcontroller may operate to generate distinct fault alert signals in response to the different fault conditions, or alternatively may operate to prevent operation of the motor. Thus, only a single A/D converter of a microcontroller or other processor is used to achieve suitable diagnostic analysis, freeing up other A/D converters of the processor for other uses.

Figure 1:
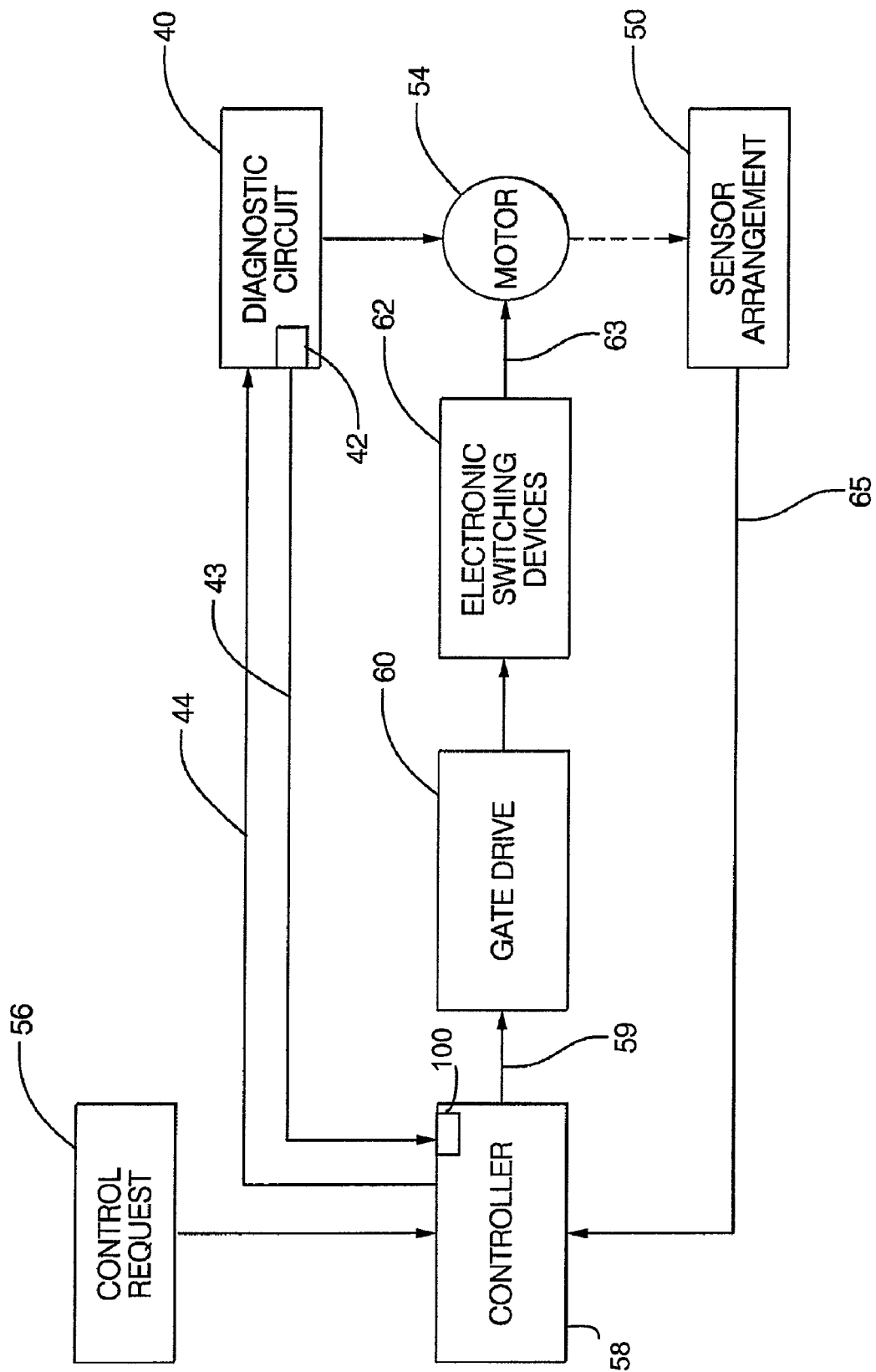
FIG. 1 is a block diagram illustrating a motor control system.

FIG. 1 is a block diagram of an exemplary motor control system having a motor 54 with a magnetic rotor (e.g., a PM brushless motor). Control requests 56 arrive at controller 58 (e.g., requesting a specific speed of operation for the motor 54). The controller 58 sends one or more PWM drive initiation signals 59 at a standard frequency to one or more gate drives 60. The gate drives 60 then step up the signal voltage to a level sufficient to effectively operate switching devices 62 associated with the motor phase winding terminals. For instance, the controller 58 may send PWM drive initiation signals 59 at 0-5V, which the gate drives 60 will then increase to 0-15V. Operation of the electronic switching devices 62 produces PWM drive signals 63 that energize the phase windings with the appropriate voltage (positive, negative or no voltage). Sensor arrangement 50 detects commutation events as they occur, providing feedback 65 to the controller 58, so that commutation can be adjusted at appropriate times. A diagnostic circuit 40 is also provided and has a single diagnostic output 42 that is connected to the A/D converter 100 associated with the controller 58. The controller 58 is also connected to circuit 40 via lines 44 to control switching devices within circuit 40 as will be described in greater detail below.

Figure 2:
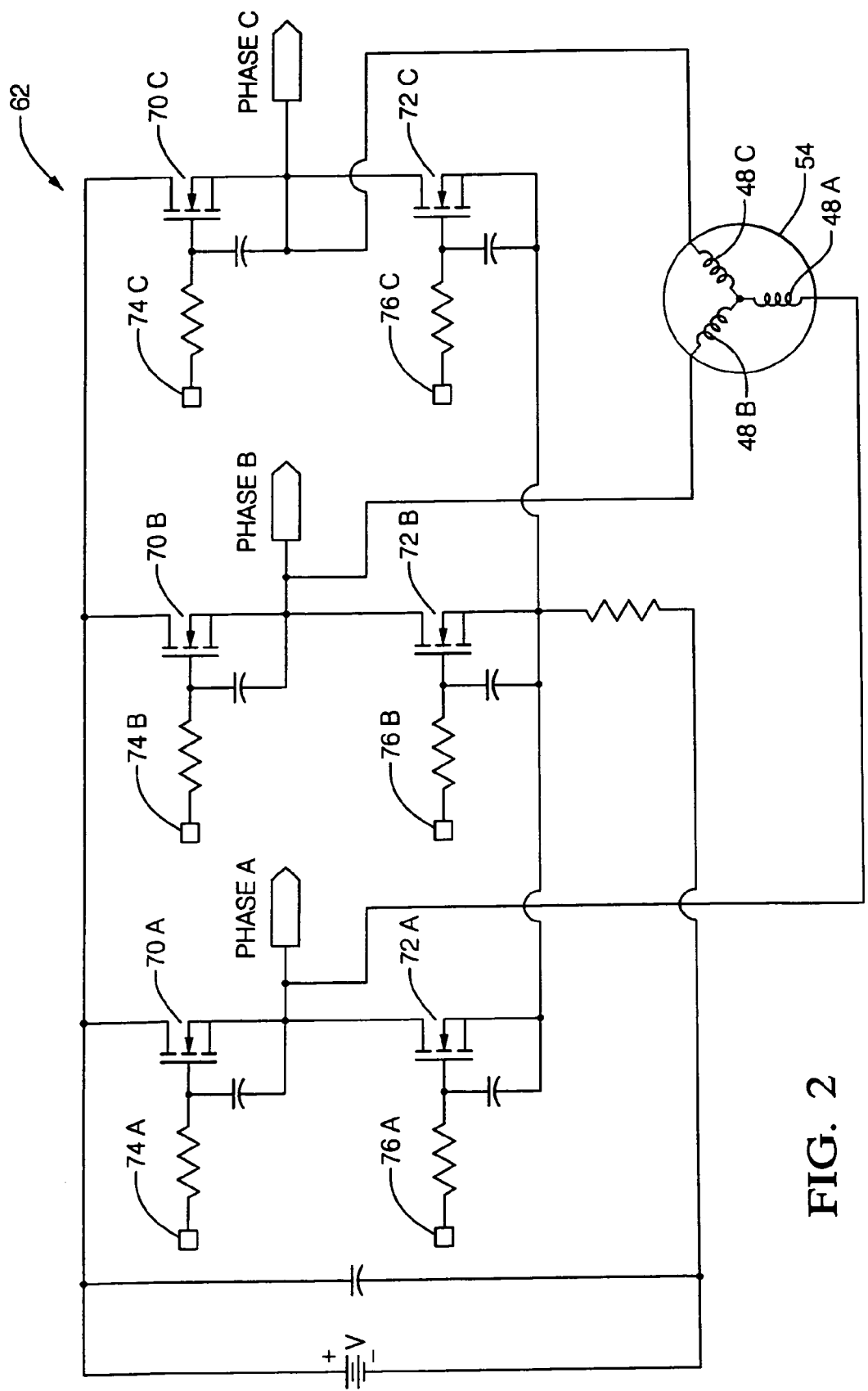
FIG. 2 is a schematic diagram of a three phase motor control system circuit.

FIG. 2 is a schematic diagram of switching device circuit 62 of FIG. 1 as connected to motor 54. Each motor phase winding 48A, 48B and 48C has a corresponding HI side electronic switching device (e.g., at the positive voltage side of the voltage source) 70A, 70B and 70C and LO side electronic switching device (e.g., at the negative side of the voltage source) 72A, 72B and 72C, respectively. The gate drives (not shown) step up the voltage of the PWM drive initiation signals, then apply the increased voltage signals to the electronic switching devices 62 via circuit inputs 74A, 74B, 74C, 76A, 76B and 76C.

Figure 3:
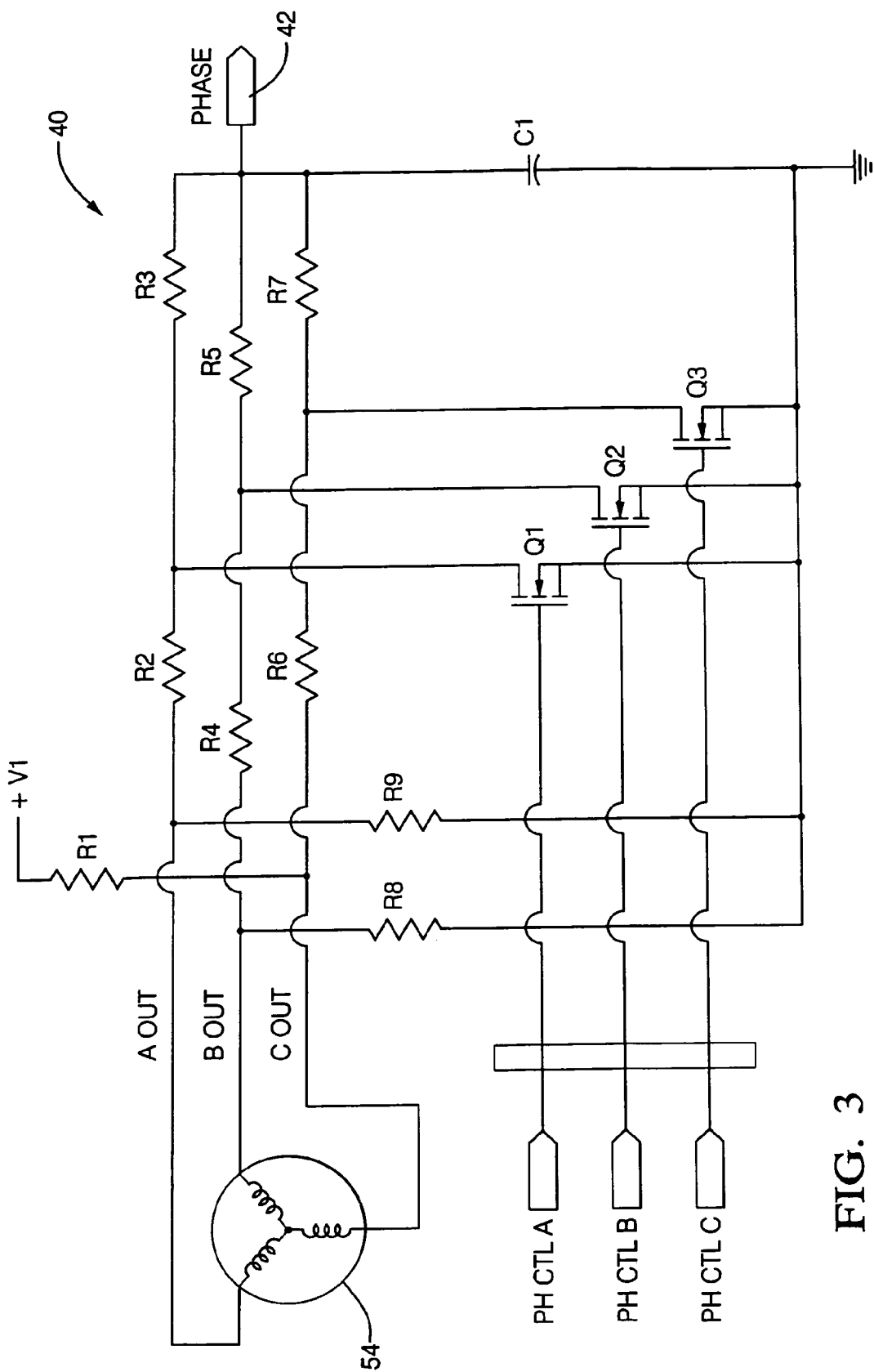
FIG. 3 is a schematic diagram of a diagnostic and feedback circuit.

FIG. 3 is a schematic depiction of one embodiment of a suitable diagnostic circuit 40 in association with motor 54. The circuit includes resistors R1-R9, capacitor C1 and transistors Q1-Q3. This circuit enables the use of a single processor A/D input to diagnose an off state fault of the motor and to determine the phase voltage applied across the active motor windings. Transistors Q1, Q2, and Q3 remain in an off state during motor diagnostics and therefore they may be ignored for the purposes of the diagnostic discussion. Biasing resistors R1, R8, and R9 are designed to bias the individual motor phases to no fault analog voltage level at when all of the motor phases are connected (note that the motor winding is a short circuit relative to the resistor values). The no fault analog voltage level is derived from the voltage divider formed by R8 in parallel with R9 to ground and R1 pulling the common node (i.e. the three motor phases) to +V1. The resistance defined by R8 in parallel with R9 (R8∥R9) is determined as:

$$R8 \| R9 = (R8*R9)/(R8+R9).$$

The no fault voltage level ($V_{NF}$) at the diagnostic output 42 is determined as:

$$V_{NF} = (V1)*[(R8 \| R9)/((R1)+(R8 \| R9))].$$

With proper selection of resistance values R1-R9, under a condition where all 3 phases of the motor are disconnected, the voltage level established at the diagnostic output 42 is significantly different from $V_{NF}$. Resistors R8 and R9 pull motor Phases A and B to ground and resistor R1 pulls motor Phase C to +V1. Resistors R4, R5, and R8 are in series to ground. This combination is in parallel with the series combination of resistors R2, R3, and R9. Resistors R1, R6, and R7 are in series to +V1. The resulting motor disconnected fault voltage level ($V_{MD}$) established at diagnostic output 42 is determined as:

$$V_{MD}=(V1)*[(RE2\|RE3)/((RE1)+(RE2\|RE3))], \text{ where}$$

$$RE1=R1+R6+R7;$$

$$RE2=R5+R4+R8; \text{ and}$$

$$RE3=R3+R2+R9.$$

Under a condition where any single phase of the motor is disconnected, the fault voltage level established at the diagnostic output 42 is the resultant voltage of the disconnected phase due to the respective biasing resistor and the resultant voltage divider created by the voltage divider of the remaining 2 biasing resistors and the 2 connected motor phases. For a phase A open fault condition, the fault voltage level ($V_{AO}$) established at the diagnostic output 42 is determined as:

$$V_{AO}=(V_{EQ})*[(RE3)/(RE1+RE2+RE3)], \text{ where}$$

$$RE1=R1\|R8;$$

$$RE2=RE4\|RE5;$$

$$RE3=R3+R2+R9;$$

$$RE4=R4+R5;$$

$$RE5=R6+R7; \text{ and}$$

$$V_{EQ}=V1*[(R8)/(\text{i } R1+R8)].$$

For a phase B open fault condition, the fault level voltage ($V_{BO}$) established at the diagnostic output 42 is determined as:

$$V_{BO}=(V_{EQ})*[(RE3)/(RE1+RE2+RE3)], \text{ where}$$

$$RE1=R1\|R9;$$

$$RE2=RE4\|RE5;$$

$$RE3=R5+R4+R8;$$

$$RE4=R2+R3;$$

$$RE5=R6+R7; \text{ and}$$

$$V_{EQ}=V1*[(R9)/(R1+R9)].$$

For a phase C open fault condition, the fault level voltage ($V_{CO}$) established at the diagnostic output 42 is determined as:

$$V_{CO}=(V1)*[(RE2)/(RE1+RE2)], \text{ where}$$

$$RE1=R1+R6+R7;$$

$$RE2=(RE3\|RE4)+(R8\|R9);$$

$$RE3=R3+R2; \text{ and}$$

$$RE4=R4+R5.$$

In an exemplary implementation of diagnostic circuit 40 where resistor R1 is selected a 1 Kohm, resistors R2-R9 are all selected at 4.99 Kohm and V1 is selected at +5 volts, the following exemplary voltage levels would result:

$$V_{NF}=3.57 \text{ V}$$

$$V_{MD}=2.03 \text{ V}$$

$$V_{AO}=3.00 \text{ V}$$

$$V_{BO}=3.00 \text{ V}$$

$$V_{CO}=2.03 \text{ V}$$

However, it is recognized that these levels could be varied by selection of different component values or via implementation of a varied circuit configuration.

Referring again to FIG. 3, additional off state diagnostics can be performed utilizing transistors Q1, Q2, and Q3. In the exemplary implementation referred to in the preceding paragraph, the motor diagnostics return only 2 distinct values for the 4 fault conditions of motor disconnected, phase A open, phase B open and phase C open. By individually enabling each of the transistors during the fault diagnostics, distinct voltage divider equations can be created by the 4 fault conditions. These additional diagnostics may be performed, for example, by selectively turning on the transistors Q1, Q2 and Q3 upon the identification of a fault state. Table 1 below provides resultant voltages for the exemplary implementation referred to in the preceding paragraph, based upon experimental data that reflects component variations etc.

TABLE 1

Exemplary Experimental Diagnostic Voltage Level Data

|  | Q1, Q2, Q3 all OFF | Only Q1 ON | Only Q2 ON | Only Q3 ON |
| --- | --- | --- | --- | --- |
| $V_{NF}$ | 3.61 V | 1.50 V | 1.50 V | 1.50 V |
| $V_{MD}$ | 2.22 V | 1.33 V | 1.33 V | 0.16 V |
| $V_{AO}$ | 3.10 V | 1.93 V | 1.00 V | 1.00 V |
| $V_{BO}$ | 3.09 V | 1.00 V | 1.93 V | 1.00 V |
| $V_{CO}$ | 2.22 V | 1.25 V | 1.25 V | 0.16 V |

Referring again to FIG. 3, under a condition where any single phase of the motor is shorted to the battery voltage, all of the motor phase voltages are at battery voltage since the motor windings are considered a short circuit relative to the resistor values. When this condition exists, the diagnostic output 42 is set high (higher than +V1) and the controller processor A/D input reads a value equal to the maximum conversion of +5V. Under a condition where any single phase of the motor is shorted to ground, all of the motor phase voltages are at ground since the motor windings are considered a short circuit relative to the resistor values. When this condition exists, the diagnostic output 42 is set to 0V.

Figure 4:
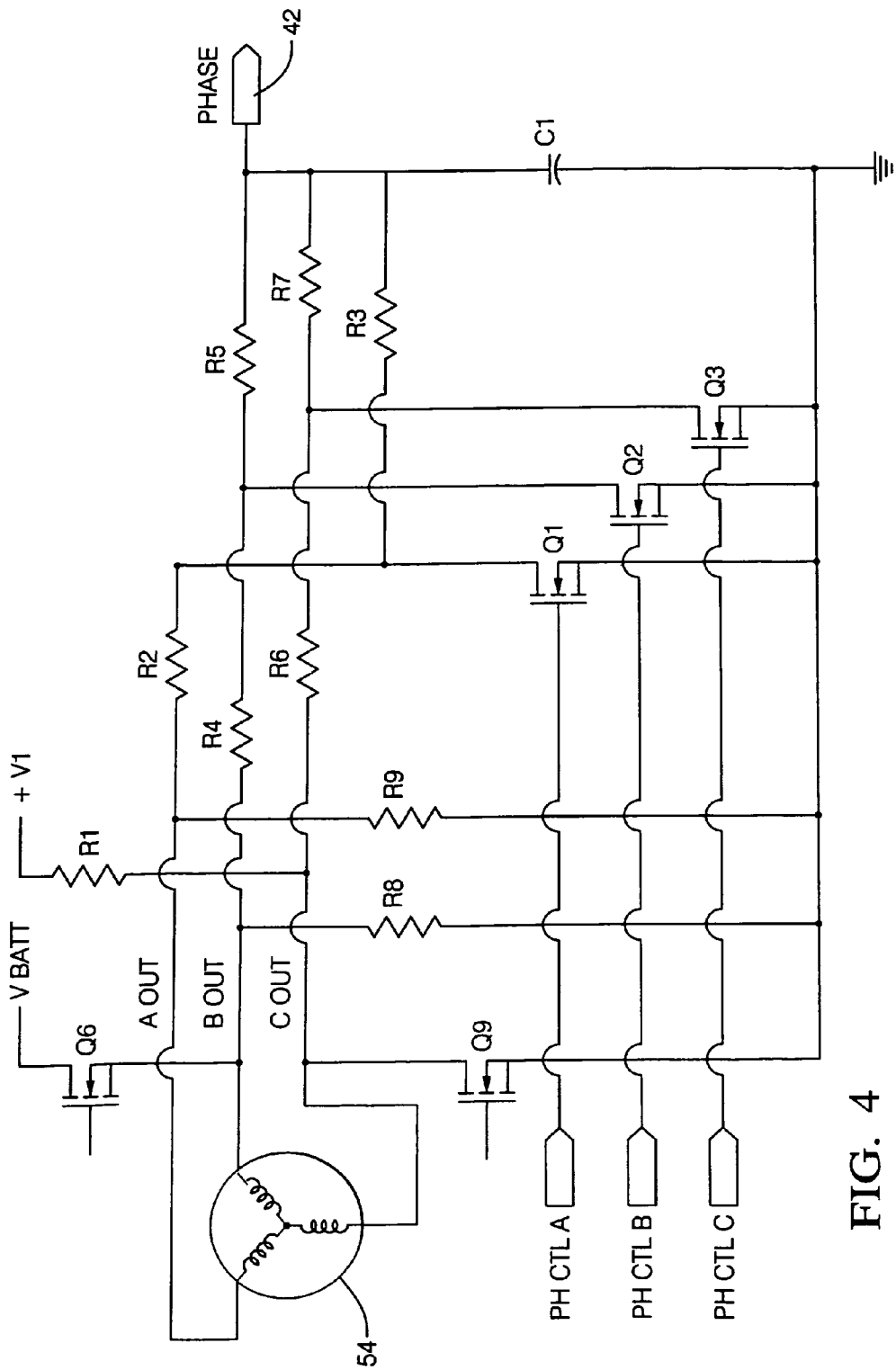
FIG. 4 is modified representation of the circuit of FIG. 3.

FIG. 4 illustrates the diagnostic circuit in a slightly redrawn condition to assist in the description of the output levels provided during the motor active phase voltage. When the motor is running, the diagnostic biasing resistors R1, R8, and R9 have no influence over the motor phase voltage reading since they have significantly higher impedance than the motor and power transistor circuitry. When the motor is in a running condition, 2 of the phases are active and the third phase is open. In FIG. 4, phases B and C are the active phases, and phase A is the open phase. The active phase C is pulled to ground by power transistor Q9 (same as transistor 72C of FIG. 2). The active phase B is Pulse Width Modulated by power transistor Q6 (same as transistor 70B of FIG. 2) to provide an average voltage at phase B equal to Vbatt times the PWM duty cycle. Transistors Q1, Q2, and Q3 are used to create a voltage divider while blanking out the voltage contribution of the open phase. The 2 transistors associated with the active phases remain in an off state since they are associated with the active Phases B and C. The transistor associated with the open phase is turned on to block the input of the open phase voltage, which is a non-zero value, and simultaneously create a voltage divider such that the voltage at the output 42 is in a valid range between 0V and 5V. In this illustration, transistor Q1 is turned on to block the motor voltage input through resistor R2. In this condition, resistor R2 has no influence on the phase voltage reading at output 42. Also, while transistor Q1 is turned on, resistor R3 creates a voltage divider at the output 42 for the summing junction for phase B and phase C. Thus, the voltage at the output 42 will be determined by the voltage of the high active phase as applied to the voltage divider. In the example of FIG. 4 where B is the high active phase, the output voltage $V_{PHASE}$ is determined as:

$$V_{PHASE} = V_{BOUT} * RDIV, \text{ where}$$

$$RDIV = (RE1/(RE1+R4+R5)), \text{ where}$$

$$RE1 = (R6+R7) \| R3; \text{ and}$$

$$V_{BOUT} = VBATT * PWM \text{ duty cycle of transistor } Q6.$$

Similar analysis and function follows for other commutation states of the motor. In an embodiment where the value of resistors R2, R4, and R6 is the same, and the value of resistors R3, R5, and R7 is the same, RDIV will be the same regardless of which phases are active.

It is to be clearly understood that the above description is intended by way of illustration and example only and is not intended to be taken by way of limitation. Changes and modifications could be made.

What is claimed is:

1. A motor system, comprising: a 3-phase DC motor having first, second and third phase windings; a drive circuit to selectively effect energization of the first, second and third phase windings during motor operation; a diagnostic and phase feedback circuit connected to indicate, during non-operation of the motor, at least a no fault state, a first fault state and a second fault state, the diagnostic circuit having one diagnostic output line at which (i) a no fault analog voltage condition is established during the no fault state, (ii) a first fault analog voltage condition is established during the first fault state and (iii) a second fault analog voltage condition is established during the second fault state, each of the voltage conditions distinct from each other; and a controller having an A/D converter operatively connected with the one diagnostic output line, wherein the controller monitors an output of the A/D converter to identify the presence of each of the no fault state, the first fault state and the second fault state; wherein the first fault voltage condition is indicative of either a motor disconnected fault or a first phase open fault, wherein the second fault voltage condition is indicative of either a second phase open fault or a third phase open fault; wherein the diagnostic and feedback circuit includes a first line associated with the first phase winding and operatively connected with the diagnostic output line, a second line associated with the second phase winding and operatively connected with the diagnostic output line and a third line associated with the third phase winding and operatively connected with the diagnostic output line, a first transistor connected between the first line and ground, a second transistor connected between the second line and ground and a third transistor connected between the third line and ground, the first, second and third transistors are normally maintained in respective OFF states during diagnostic monitoring when the motor is not operating; and wherein the controller is operatively connected to control the ON/OFF state of each of the first, second and third transistors, the controller upon identification of the first fault state selectively turns on each of the transistors for supplemental diagnostic evaluation.

2. The motor system of claim 1 wherein, responsive to identification of the first fault state the controller generates a first fault alert signal, and responsive to identification of the second fault state the controller generates a second fault alert signal.

3. The motor system of claim 1 wherein, responsive to identification of the first fault state the controller prevents operation of the motor, and responsive to identification of the second fault state the controller prevents operation of the motor.

4. The motor system of claim 1 wherein the first fault state is either a motor disconnected state or a first phase open state, and the second fault state is either a second phase open state or a third phase open state.

5. The motor system of claim 4 wherein a third fault analog voltage condition is established at the diagnostic output line upon the occurrence of a windings shorted to ground fault state.

6. The motor system of claim 5 wherein a forth analog voltage fault condition is established at the diagnostic output line upon the occurrence of a windings shorted to battery fault state.

7. The motor system of claim 1 wherein (i) the controller identifies the no fault state if voltage at the diagnostic output line is within a first voltage range, (ii) the controller identifies the first fault state if voltage at the diagnostic output line is within a second voltage range and (iii) the controller identifies the second fault state if voltage at the diagnostic output line is within a third voltage range, where the first, second and third voltage ranges are non-overlapping.

8. The motor system of claim 1 wherein the one diagnostic output line is operatively and simultaneously connected to each of a firs phase output line, a second phase output line and a third phase output line.

9. A motor system, comprising: a 3-phase DC motor having first, second and third phase windings; a drive circuit to selectively effecting energization of the first, second and third phase windings during motor operation; a diagnostic and phase feedback circuit connected to indicate, during non-operation of the motor, at least a no fault state, a first fault state and a second fault state, the diagnostic circuit having one diagnostic output line at which (i) a no fault analog voltage condition is established during the no fault state, (ii) a first fault analog voltage condition is established during the first fault state and (iii) a second fault analog voltage condition is established during the second fault state, each of the voltage conditions distinct from each other; and a controller having an A/D converter operatively connected with the one diagnostic output line, wherein the controller monitors an output of the A/D converter to identify the presence of each of the no fault state, the first fault state and the second fault state; wherein the first fault voltage condition is indicative of either a motor disconnected fault or a first phase open fault, wherein the second fault voltage condition is indicative of either a second phase open fault or a third phase open fault; wherein the diagnostic and feedback circuit includes a first line associated with the first phase winding and operatively connected with the diagnostic output line, a second line associated with the second phase winding and operatively connected with the diagnostic output line and a third line associated with the third phase winding and operatively connected with the diagnostic output line, a first transistor connected between the first line and ground, a second transistor connected between the second line and ground and a third transistor connected between the third line and ground, the first, second and third transistors are normally maintained in respective OFF states during diagnostic monitoring when the motor is not operating; wherein the one diagnostic output line also functions as a phase voltage feedback line during motor operation, the controller is operatively connected to the control the ON/OFF state.

\* \* \* \* \*